United States Patent
Kimura et al.

(10) Patent No.: US 9,347,128 B2
(45) Date of Patent: *May 24, 2016

(54) METHOD FOR FORMING DIELECTRIC THIN FILM

(71) Applicant: ULVAC, Inc., Chigasaki-shi, Kanagawa (JP)

(72) Inventors: Isao Kimura, Susono (JP); Takehito Jinbo, Chigasaki (JP); Hiroki Kobayashi, Chigasaki (JP); Youhei Endou, Susono (JP); Youhei Oonishi, Susono (JP)

(73) Assignee: ULVAC, INC., Chigasaki-shi (JP)

( * ) Notice: Subject to any disclaimer, the term of this patent is extended or adjusted under 35 U.S.C. 154(b) by 227 days.

This patent is subject to a terminal disclaimer.

(21) Appl. No.: 13/857,421

(22) Filed: Apr. 5, 2013

(65) Prior Publication Data

US 2013/0220799 A1    Aug. 29, 2013

Related U.S. Application Data

(63) Continuation of application No. PCT/JP2011/072805, filed on Oct. 3, 2011.

(30) Foreign Application Priority Data

Oct. 6, 2010    (JP) .................................. 2010-227008

(51) Int. Cl.
*H01L 41/316*    (2013.01)
*H01J 37/34*    (2006.01)
(Continued)

(52) U.S. Cl.
CPC ............. *C23C 14/088* (2013.01); *C23C 14/024* (2013.01); *C23C 14/35* (2013.01);
(Continued)

(58) Field of Classification Search
CPC .... C23C 14/024; C23C 14/088; C23C 14/35; H01L 41/1876; H01L 41/187; H01L 41/316; H01L 37/025; H01L 21/02197; H01L 21/02266; H01J 37/3464; H01J 37/3426; H01J 37/34; C01P 2006/40; C01P 2002/72; C01G 25/006; C01G 21/06
See application file for complete search history.

(56) References Cited

U.S. PATENT DOCUMENTS 5,397,446 A * 3/1995 Ishihara et al. .......... 204/192.18
6,333,066 B1    12/2001 Kim
(Continued)

FOREIGN PATENT DOCUMENTS

JP    H5-17147    1/1993
JP    H11-284136    10/1999
(Continued)

OTHER PUBLICATIONS

International Preliminary Report on Patentability dated May 16, 2013 issued in counterpart application No. PCT/JP2011/072805 (6 pages).
(Continued)

*Primary Examiner* — Michael Band
(74) *Attorney, Agent, or Firm* — Kratz, Quintos & Hanson, LLP

(57) ABSTRACT

A method for forming a dielectric thin film that forms a PZT thin film having a (100)/(001) orientation. After a seed layer is formed by adhering PbO gas to a surface of a substrate, a voltage is applied to a target of lead zirconate titanate (PZT) and perform sputtering, while the substrate is heated inside of an evacuated vacuum chamber. Then, a PZT thin film is formed on the surface of the substrate. Because Pb and O are supplied from the seed layer, a PZT film having a (001)/(100) orientation can be formed without lack of Pb.

5 Claims, 3 Drawing Sheets

(51) Int. Cl.
- *C23C 14/35* (2006.01)
- *C23C 14/08* (2006.01)
- *C23C 14/02* (2006.01)
- *C01G 25/00* (2006.01)
- *C01G 21/06* (2006.01)

(52) U.S. Cl.
CPC ............ H01J 37/34 (2013.01); H01J 37/3426 (2013.01); H01J 37/3464 (2013.01); H01L 41/316 (2013.01); *C01G 21/06* (2013.01); *C01G 25/006* (2013.01); *C01P 2002/72* (2013.01); *C01P 2006/40* (2013.01)

(56) References Cited

U.S. PATENT DOCUMENTS

2009/0066188 A1* 3/2009 Naono et al. .................. 310/330
2010/0206713 A1* 8/2010 Li .......................... C23C 14/088
　　　　　　　　　　　　　　　　　　　　　　　204/192.12
2013/0228453 A1* 9/2013 Kimura et al. ........... 204/192.15

FOREIGN PATENT DOCUMENTS

| | | |
|---|---|---|
| JP | 2003-81694 A1 | 3/2003 |
| JP | 2007-327106 A1 | 12/2007 |
| JP | 2008-112552 A1 | 5/2008 |
| JP | 2008-218620 A1 | 9/2008 |
| JP | 2010-84180 A1 | 4/2010 |

OTHER PUBLICATIONS

International Search Report for International Application No. PCT/JP2011/072805 dated Nov. 15, 2011.

Office Action dated Jul. 15, 2014 corresponding of Japanese Patent Application No. 2012-537709 with English translation.

Office Action issued on Oct. 21, 2015 for corresponding Chinese Patent Application No. 201180053170.0, with translation.

* cited by examiner

METHOD FOR FORMING DIELECTRIC THIN FILM

BACKGROUND

The present invention generally relates to a method for forming a dielectric thin film.

Currently, a piezoelectric element using a ferroelectric material (such as, lead zirconate titanate (Pb (Zr, Ti)$O_3$, PZT)) is applied to MEMS (micro electromechanical systems) technique (such as, an inkjet head and an acceleration sensor).

FIG. 4 is a graph showing piezoelectric characteristics of a PZT thin film having a (100)/(001) orientation and a PZT thin film having a (111) orientation. The PZT thin film with (100)/(001) orientation is known to show a piezoelectric characteristic greater than the piezoelectric characteristic of the PZT thin film with the (111) orientation.

A description will be given of a conventional method for forming a dielectric thin film.

When a piezoelectric element is formed, as the substrate to be film formed, a Si substrate having a thermally-oxidized film on which a Ti thin film as an adhesive layer and a noble metal thin film as a lower electrode layer preliminarily laminated in this order, is used. The noble metal thin film is a Pt or Ir thin film preferentially oriented to a (111) plane.

FIG. 5 shows a temperature change of a heat generating member which heats the substrate.

The heat generating member is heated up to 640 degrees Celsius inside the evacuated vacuum chamber and held so as to set the substrate at an appropriate film forming temperature for forming a PZT thin film.

Sputtering gas is introduced into the vacuum chamber and an AC voltage is applied to the target; the introduced sputtering gas is ionized; and plasma is formed. Ions in the plasma sputter a surface of the target, and PZT particles are discharged from the target.

A part of the PZT particles discharged from the target enters a surface of the heated substrate; and thus, a PZT thin film is formed on the noble metal thin film of the substrate.

After the PZT thin film having a predetermined film thickness is formed, the application of the voltage to the target is stopped and the introduction of the sputtering gas is halted. A temperature of the heat generating member is lowered and held at 400 degrees Celsius so as to cool the substrate.

FIG. 6 shows X-ray diffraction patterns of three portions of the center portion (Center), the edge portion (Edge), and the middle portion (Middle) between the center portion and the edge portion in a PZT thin film formed on a Pt thin film using the conventional method for forming the dielectric thin film. It is understood that the PZT thin film to be formed is preferentially oriented in a (111) direction.

In other words, in the conventional method for forming the dielectric thin film, there has been a problem in that it is difficult to form a PZT thin film having a (100)/(001) orientation; see, for example, JPA No. 2007-327106, JPA No. 2010-084180 and JPA No. 2003-081694.

SUMMARY OF THE INVENTION

The present invention has been made to solve the above-described problems of the conventional technique; and it is an object of the present invention to provide a method for forming a dielectric thin film that forms a PZT thin film having a (100)/(001) orientation.

The inventors estimated that in the conventional dielectric film forming apparatus, Pb lack may have occurred due to diffusion of Pb in a direction of the noble metal thin film and re-evaporation of Pb at the beginning of forming the PZT thin film and $TiO_2$ is then formed; and thus, a PZT thin film formed on a $TiO_2$/noble metal thin film was preferentially oriented in a (111) direction. The inventors found that preliminary formation of a seed layer of PbO on the noble metal thin film achieved the above-described object.

The present invention made based on this knowledge is a method for forming a dielectric thin film. The present invention is a method for forming a dielectric thin film, including the steps of a film forming step for applying a voltage to a target of lead zirconate titanate (PZT) to perform sputtering while heating a substrate inside of an evacuated vacuum chamber and forming a PZT thin film on a surface of the substrate. The method is characterized in that a seed layer forming step for forming a seed layer is by adhering PbO gas to the surface of the substrate before the film forming step.

The present invention is the method for forming the dielectric thin film, wherein in the seed layer forming step, an emission source containing Pb and O in its chemical structure is heated inside the vacuum chamber so as to emit PbO gas from the emission source.

The present invention is the method for forming the dielectric thin film, wherein in the seed layer forming step, inert gas, which does not react with PbO, is introduced inside of the vacuum chamber, while the PbO gas is emitted from the emission source.

The present invention is the method for forming the dielectric thin film, wherein in the seed layer forming step, the emission source is heated to a temperature higher than a temperature of the substrate in the film forming step.

The present invention is the method for forming the dielectric thin film, as previously discussed, wherein in the seed layer forming step, the emission source is heated to a temperature higher than a temperature of the substrate in the film forming step by at least 50 degrees Celsius.

The present invention is the method for forming the dielectric thin film, as previously discussed, wherein the substrate includes a noble metal thin film made of Pt or Ir, and a surface of the noble metal thin films is preferentially oriented to a (111) plane.

The PZT thin film having a (100)/(001) orientation can be formed on a Pt or Ir thin film having a (111) orientation. The present invention provides a piezoelectric element having a piezoelectric characteristic larger than the conventional configuration.

DETAILED DESCRIPTION OF THE INVENTION

<Structure Of A Dielectric Film Forming Apparatus>

A description will be given of a structure of a dielectric film forming apparatus used in a method for forming a dielectric thin film according to the present invention.

Figure 1:
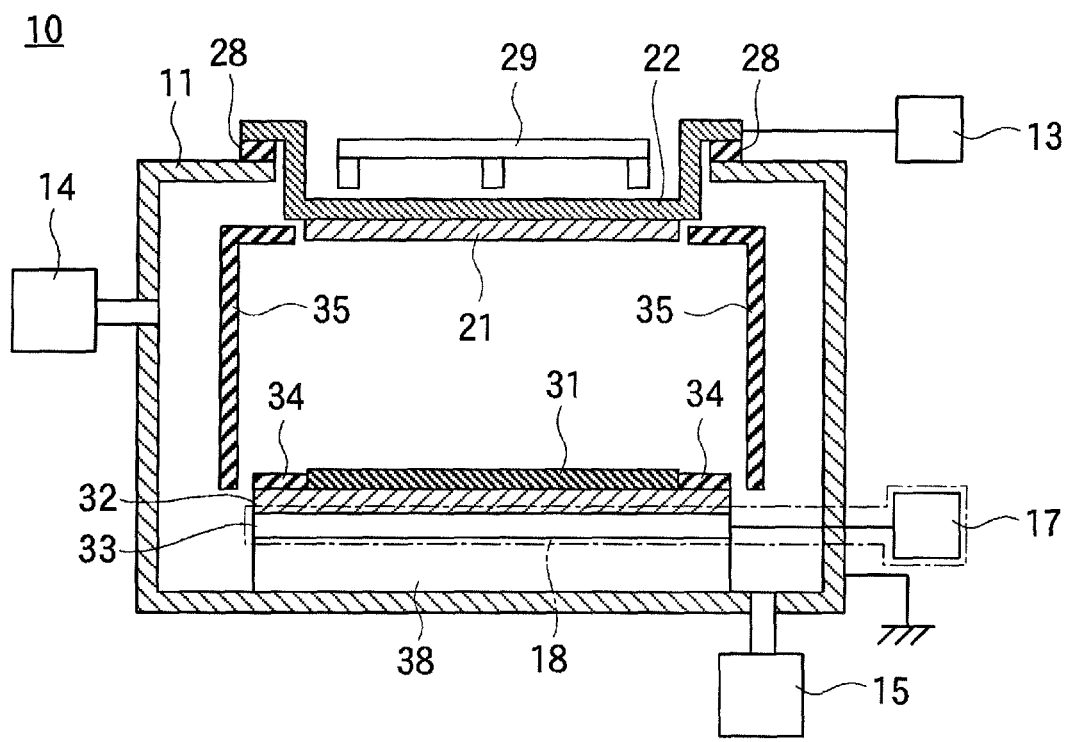
FIG. 1 is an internal configuration diagram showing a dielectric film forming apparatus using a method for forming a dielectric thin film according to the present invention.

FIG. 1 is an internal configuration diagram of a dielectric film forming apparatus 10.

The dielectric film forming apparatus 10 includes a vacuum chamber 11, a target 21 of PZT provided in the vacuum chamber 11, a substrate holding pedestal 32 for holding a substrate 31 provided on a position facing the target 21, a substrate heating portion 18 for heating the substrate 31 held on the substrate holding pedestal 32, a sputtering power supply 13 applying electric voltage to the target 21, a sputtering gas introduction unit 14 for introducing a sputtering gas inside the vacuum chamber 11, and first and second deposition preventive plates 34 and 35 provided in the vacuum chamber at positions where PZT particles discharged from the target 21 adhere to.

A cathode electrode 22 is mounted on a wall surface of the vacuum chamber 11 via an insulating member 28. The cathode electrode 22 and the vacuum chamber 11 are electrically insulated from each other. The vacuum chamber 11 is set to the ground potential.

A surface of the cathode electrode 22 is exposed inside the vacuum chamber 11. The target 21 is fixed in close contact with the center portion of the surface of the cathode electrode 22. The target 21 and the cathode electrode 22 are electrically connected to each other.

The sputtering power supply 13 is disposed outside of the vacuum chamber 11 and electrically connected to the cathode electrode 22. The sputtering power supply 13 is configured to apply an AC voltage to the target 21 through the cathode electrode 22.

At the side of the cathode electrode 22 opposite to the target 21, a magnet unit 29 is disposed. The magnet unit 29 is configured to generate magnetic lines on the surface of the target 21.

Here, the substrate holding pedestal 32 is formed of silicon carbide (SiC). The substrate holding pedestal 32 includes an outer periphery, which is formed larger than an outer periphery of the substrate 31, and a surface of the substrate holding pedestal 32 faces the surface of the target 21. The center portion of the surface of the substrate holding pedestal 32 electrostatically chucks so as to hold the substrate 31.

When the center portion of the surface of the substrate holding pedestal 32 electrostatically chucks the substrate 31, a back surface of the substrate 31 is brought into close contact with the center portion of the surface of the substrate holding pedestal 32, and the substrate 31 is thermally connected to the substrate holding pedestal 32.

The first deposition preventive plate 34 is made of ceramic (such as, quartz, alumina or the like). The first deposition preventive plate 34 is formed in a ring shape having an inner periphery larger than the outer periphery of the substrate 31, and disposed to cover an edge portion at the outside of the center portion on the surface of the substrate holding pedestal 32. Therefore, the particles discharged from the target 21 are prevented from adhering to the edge portion on the surface of the substrate holding pedestal 32.

A back surface of the first deposition preventive plate 34 is brought into close contact with the edge portion on the surface of the substrate holding pedestal 32. The first deposition preventive plate 34 is thermally connected to the substrate holding pedestal 32.

When the substrate 31 is placed on the center portion of the surface of the substrate holding pedestal 32, the first deposition preventive plate 34 surrounds the outside of the outer periphery of the substrate 31.

The second deposition preventive plate 35 is made of ceramic (such as, quartz, alumina or the like). The second deposition preventive plate 35 is formed in a cylindrical shape having an inner periphery larger than an outer periphery of the target 21 and the outer periphery of the substrate 31. The second deposition preventive plate 35 is disposed between the substrate holding pedestal 32 and the cathode electrode 22, and surrounds lateral side of the space between the substrate 31 and the target 21. The particles discharged from the target 21 are prevented from adhering to the wall surface of the vacuum chamber 11.

The substrate heating portion 18 includes a heat generating member 33 and a heating power supply 17.

Here, the heat generating member 33 is formed of SiC, and disposed on a side of the substrate holding pedestal 32 opposite the substrate 31; and the heating power supply 17 is electrically connected to the heat generating member 33. When a direct current flows from the heating power supply 17 to the heat generating member 33, the heat generating member 33 generates heat and then the substrate holding pedestal 32 is heated. Therefore, the substrate 31 and the first deposition preventive plate 34 on the substrate holding pedestal 32 are heated together.

The back surface of the substrate 31 is brought into close contact with the center portion of the surface of the substrate holding pedestal 32. Heat transfer occurs equally from the center portion to the edge portion of the substrate 31.

At the side of the heat generating member 33 opposite the substrate holding pedestal 32, a cooling device 38 is disposed. The cooling device 38 circulates a temperature controlled cooling medium inside the cooling device 38. Therefore, heat generated by the heat generating member 33 does not heat the wall surface of the vacuum chamber 11.

The sputtering gas introduction unit 14 is connected to the inside of the vacuum chamber 11 to introduce sputtering gas into the vacuum chamber 11.

<Method For Forming A Dielectric Thin Film>

A method for forming a dielectric thin film of the present invention will be described.

Here, a thermally-oxidized film ($SiO_2$) of a Si substrate, on which a Ti thin film as an adhesive layer of and a noble metal thin film as a lower electrode layer are preliminarily laminated in this order, is used as the substrate 31 to be film formed. The noble metal thin film is a Pt or Ir thin film preferentially oriented to a (111) plane.

A temperature of the substrate 31 appropriate for forming the PZT thin film (hereinafter, referred to as a film forming temperature) is preliminarily obtained by a test or a simulation.

First, as a preparation step, an vacuum evacuation device 15 is connected to the inside of the vacuum chamber 11 so as to evacuate the inside of the vacuum chamber 11. Hereinafter, vacuum evacuation is continued to maintain a vacuum ambience inside of the vacuum chamber 11.

Here, a dummy substrate that is different from the substrate 31 to be film formed is carried into the vacuum chamber 11 and placed in the center portion on the surface of the substrate holding pedestal 32, while the vacuum ambience inside the vacuum chamber 11 is maintained. Subsequently, sputtering is performed on the target 21 so as to preliminarily adhere the PZT thin film to the surfaces of the first deposition preventive plate 34. Then, the dummy substrate is carried out to the outside of the vacuum chamber 11, while the vacuum ambience inside the vacuum chamber 11 is maintained.

The present invention is not limited to a method which performs sputtering using a dummy substrate inside of the vacuum chamber 11 insofar as the method which adheres a metal compound (hereinafter referred to as an emission source) containing lead (Pb) and oxygen (O) in its chemical structure to the surface of the first deposition preventive plate 34. The first deposition preventive plate 34 on which a metal compound containing Pb and O in a chemical structure (such as, PZT and PbO) is preliminarily adhered by another film forming apparatus may be carried into the vacuum chamber 11 and used.

While the vacuum ambience inside of the vacuum chamber 11 is maintained, the substrate 31 to be film formed is carried into the vacuum chamber 11. The substrate 31 is held in the center portion on the surface of the substrate holding pedestal 32 in a direction where the noble metal thin film on the surface of the substrate 31 faces the surface of the target 21.

Cooling medium under temperature control is circulated in the cooling device 38.

Figure 2:
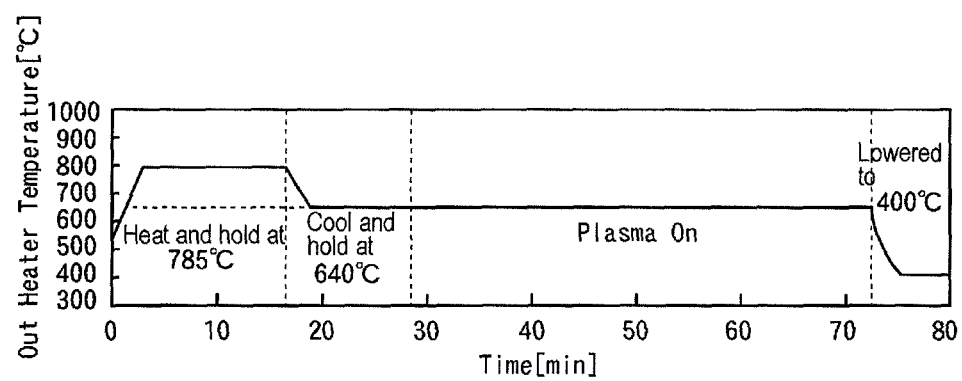
FIG. 2 is a graph showing a temperature change of a heat generating member in the method for forming the dielectric thin film according to the present invention.

FIG. 2 shows a temperature change of the heat generating member 33 in a seed layer forming step and a film forming step, as discussed below.

As the seed layer forming step, inert gas, which does not react with PbO, is introduced into the vacuum chamber 11 from the sputtering gas introduction unit 14. Here, Ar gas, which is the sputtering gas, is employed as the inert gas. Hereinafter, introduction of the inert gas is continued.

The emission source containing Pb and O in its chemical structure is heated inside the vacuum chamber 11 so as to emit PbO gas from the emission source.

A direct current flows to the heat generating member 33 from the heating power supply 17; and the heat generating member 33 is heated. The PZT thin film adhered to the first deposition preventive plate 34 is set to a temperature higher than the preliminarily obtained film forming temperature. The PbO gas is emitted from the PZT thin film preliminarily attached to the first deposition preventive plate 34.

It is preferable that the PZT thin film adhered to the first deposition preventive plate 34 is heated to a temperature higher than the preliminarily obtained film forming temperature by at least 50 degrees Celsius. This is because more PbO gas is emitted. Here, the heat generating member 33 is heated to 785 degrees Celsius and this temperature is held.

The PbO gas adheres on the noble metal thin film of the surface of the substrate 31; and a seed layer of PbO is formed on the noble metal thin film of the surface of the substrate 31.

The heat generating member 33 is cooled in such a manner that the substrate 31 is set to the film forming temperature. Here, the heat generating member 33 is cooled to 640 degrees Celsius and this temperature is held.

Subsequently, as the film forming step, the substrate 31 is held at the film forming temperature; and while Ar gas which is the sputtering gas is introduced into the vacuum chamber 11 from the sputtering gas introduction unit 14, an AC voltage is applied to the cathode electrode 22 from the sputtering power supply 13. The introduced sputtering gas is ionized and plasma is formed. Ions in the plasma are captured by the magnetic line generated by the magnet unit 29 and enter the surface of the target 21. Then, PZT particles are flicked from the target 21.

A part of the PZT particles discharged from the target 21 enters the surface of the substrate 31. The seed layer of PbO is preliminarily formed on the noble metal thin film of the surface of the substrate 31, so that Pb and O are supplied from the seed layer; and thus, Lack of Pb does not occur on the PZT thin film. A PZT film having a (001)/(100) orientation is formed on the seed layer.

Figure 3:
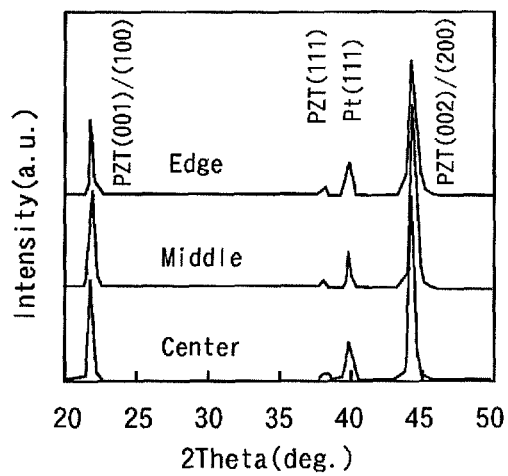
FIG. 3 is a graph showing X-ray diffraction patterns of PZT thin films formed by the method for forming the dielectric thin film according to the present invention.
Figure 4:
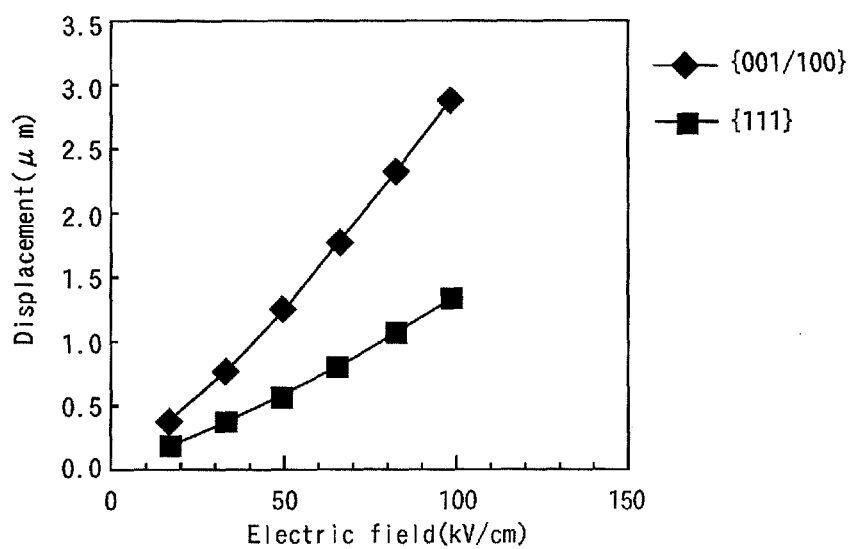
FIG. 4 is a graph showing piezoelectric characteristics of a PZT thin film having a (100)/(001) orientation and a PZT thin film having a (111) orientation.
Figure 5:
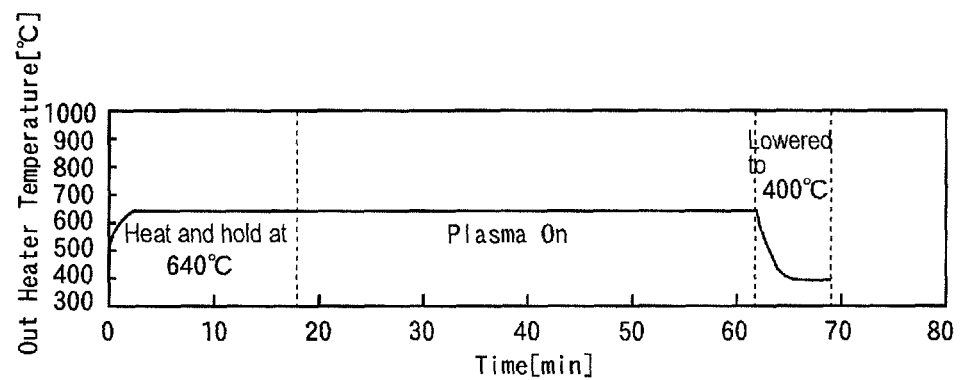
FIG. 5 is a graph showing a temperature change of a heat generating member in a conventional method for forming a dielectric film.
Figure 6:
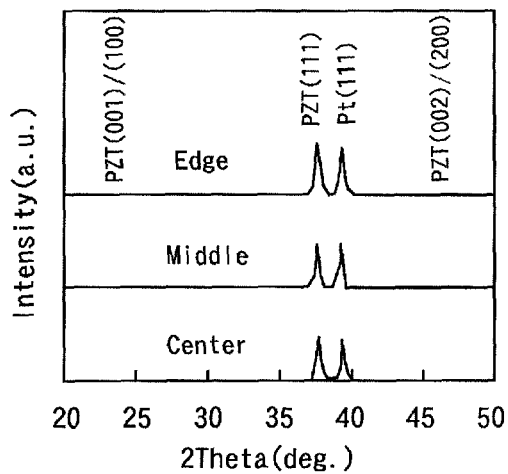
FIG. 6 is a graph showing X-ray diffraction patterns of PZT thin films formed by the conventional method for forming the dielectric thin film.

FIG. 3 shows X-ray diffraction patterns of three portions of the center portion (Center), the edge portion (Edge), and the middle portion (Middle) between the center portion and the edge portion in a PZT thin film formed on a Pt thin film using the film formation method according to the present invention.

By the X-ray diffraction patterns in FIG. 3, it is understood that a PZT thin film preferentially oriented in a (100)/(001) direction is formed.

A part of the PZT particles discharged from the target 21 is adhered to the surface of the first deposition preventive plate 34, and becomes an emission source of PbO gas in the next seed layer forming step.

After a PZT thin film having a predetermined film thickness is formed on the substrate 31, the voltage applied from the sputtering power supply 13 to the cathode electrode 22 is stopped and the introduction of the sputtering gas from the sputtering gas introduction unit 14 into the vacuum chamber 11 is halted.

The supply of the current from the heating power supply 17 to the heat generating member 33 is stopped so as to cool the heat generating member 33 in a manner such that the substrate 31 is set to a temperature lower than the film forming temperature. This is because the substrate 31 is transferred by a transfer robot. Here, the heat generating member 33 is cooled to 400 degrees Celsius and this temperature is held.

The substrate 31 on which the film has been formed is carried out to the outside of the vacuum chamber 11, while the vacuum ambience inside of the vacuum chamber 11 is maintained. Subsequently, another substrate 31 on which the film has not been formed is carried into the vacuum chamber 11. The seed layer forming step and the film forming step, as discussed above, are repeated.

The seed layer forming step of the present invention is not limited to the method whereby the PZT thin film attached to the first deposition preventive plate 34 is heated insofar as the emission source containing Pb and O in its chemical structure is heated inside of the vacuum chamber 11 to emit PbO gas from the emission source. The heat generating member may be disposed on an outer peripheral side surface of the second deposition preventive plate 35; and a PZT thin film adhered to an inner peripheral side surface of the second deposition preventive plate 35 may be heated so as to emit PbO gas. In this case, the emitted PbO gas enters the surface of the substrate 31 without collision with the inert gas. Accordingly, the introduction of the inert gas can be omitted.

A crucible (not shown) may be disposed separately from the first deposition preventive plate 34 inside of the vacuum chamber 11. An emission source (such as, PZT and PbO) may be set inside the crucible and the emission source inside the crucible may be heated so as to emit the PbO gas. Disposing the opening of the crucible to face a direction in such a manner that the emitted PbO gas enters the surface of the substrate 31 allows omitting the introduction of the inert gas.

The seed layer forming step of the present invention is not limited to the method whereby the emission source containing Pb and O in its chemical structure is heated inside of the vacuum chamber 11 in order to emit the PbO gas from the emission source insofar as the PbO gas is adhered to the surface of the substrate 31. The seed layer forming step may include the structural arrangement whereby the PbO gas emitting portion (not shown) disposed outside of the vacuum chamber 11 for emitting PbO gas is connected to the inside of the vacuum chamber 11, and PbO gas is introduced into the vacuum chamber 11 from the PbO gas emitting portion so as to adhere the PbO gas to the surface of the substrate 31.

Similar to the method that uses the first and second deposition preventive plates 34 and 35, in the case where an emission source to be heated is disposed in a position where PZT particles emitted from the target 21 adhere, the PZT particles adhere to the emission source in the film forming step; that is, the emission source is refilled. This improves efficiency in the use of film formation material compared to the method that uses the PbO gas emitting portion. Accordingly, this method is preferred.

DESCRIPTION OF REFERENCE NUMERALS 11 vacuum chamber
21 target
31 substrate

What is claimed is:

1. A method for forming a dielectric thin film inside of an evacuated vacuum chamber, comprising the steps of:
    a preliminary step for adhering compounds containing Pb and O to a deposition preventing plate, where the deposition preventing plate surrounds a substrate:
    a seed layer forming step for forming a seed layer of PbO by adhering PbO gas to a surface of the substrate: and
    a film forming step for applying a voltage to a target of lead zirconate titanate (PZT) to perform sputtering while heating the substrate and forming a PZT thin film on the surface or the substrate,
    wherein the preliminary step is performed first, the seed layer forming step is performed second, and the film forming step is performed third,
    wherein in the preliminary step, the target of PZT is sputtered to adhere both a PZT thin film on a surface of a dummy substrate and the compounds containing Pb and O on the deposition preventing plate,
    wherein in the seed layer forming step, PbO gas is emitted inside the vacuum chamber by heating the compounds containing Pb and O on the deposition preventing plate by a generating member, and
    wherein in the film forming step, sputtered particles of PZT are deposited on the seed layer and the PZT thin film is formed on the seed layer of PbO.

2. The method for forming the dielectric thin film according to claim 1, wherein in the seed layer forming step, inert gas that does not react with PbO is introduced inside of the vacuum chamber, while the PbO gas is emitted from the compounds containing Pb and O on the deposition preventing plate.

3. The method for forming the dielectric thin film according to claim 2, wherein in the seed layer forming step, the compounds containing Pb and O on the deposition preventing plate are heated to a temperature higher than a temperature of the substrate in the film forming step.

4. The method for forming the dielectric thin film according to claim 3, wherein in the seed layer forming step, the compounds containing Pb and O on the deposition preventing plate are heated to a temperature higher than a temperature of the substrate in the film forming step by at least 50 degrees Celsius.

5. The method for forming the dielectric thin film according to claim 1, wherein
    the substrate includes a noble metal thin film made of Pt or Ir, and a surface of the noble metal thin film is oriented to a (111) plane.

* * * * *